US009263614B2

(12) United States Patent
Deng et al.

(10) Patent No.: US 9,263,614 B2
(45) Date of Patent: Feb. 16, 2016

(54) IN-FIBER FILAMENT PRODUCTION

(75) Inventors: Daosheng Deng, Cambridge, MA (US);
Nicholas D. Orf, Somerville, MA (US);
Ayman F. Abouraddy, Olievdo, FL (US); Yoel Fink, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 597 days.

(21) Appl. No.: 12/912,893

(22) Filed: Oct. 27, 2010

(65) Prior Publication Data
US 2011/0097581 A1  Apr. 28, 2011

Related U.S. Application Data

(60) Provisional application No. 61/279,857, filed on Oct. 27, 2009.

(51) Int. Cl.
*D01F 8/00* (2006.01)
*H01L 31/0352* (2006.01)
(Continued)

(52) U.S. Cl.
CPC ........ *H01L 31/035281* (2013.01); *H01L 31/08* (2013.01); *H01L 31/09* (2013.01);
(Continued)

(58) Field of Classification Search
CPC ............ Y02E 10/50; D02G 3/36; D01F 8/00; B29D 11/00663; B29D 11/00721; B29C 47/0028; B29C 47/12; B29C 47/54; B29C 51/14; B29C 51/04; B29C 47/0014; B29C 55/30; B29C 55/22; B29C 47/00; B23P 17/00; B29L 2031/60; B29B 11/16; C03B 7/01222; C03B 37/026; C03B 13/00; C03B 13/003; C03B 37/01205; C03B 37/01228; C03B 37/0124; C03B 37/01274; C03B 37/0256; C03B 37/02781; C03B 2201/30; C03B 2201/82; C03B 2201/86; C03B 2203/02; C03B 2203/04; C03B 2203/12; C03B 2203/10; C03B 2203/14; C03B 2203/16; C03B 2203/20; C03B 2203/18; C03B 2203/223; C03B 2203/32; C03B 2203/34; C03B 2203/42; C03B 2203/30; C03B 37/028; C03B 37/00; C03B 37/022; C03B 37/025; C03B 37/027; C03B 37/02754;
C03B 37/01268; G02B 6/02361; G02B 6/02366; G02B 6/02; G02B 6/02304; G02B 6/02328; G02B 6/02371; G02B 6/26; G02B 6/036; G02B 6/44; G02B 6/107; G02B 6/032; G02B 6/03694; G02B 6/02333; G02B 6/02347; G02B 6/02357; G01J 3/02; G01J 3/0218; G01J 2003/1213; H01L 35/16; H01L 35/34; H01L 35/32; H01L 31/095; H01L 27/14601; H01L 31/035281; H01L 31/08; H01L 27/1446
USPC ........... 385/100, 127, 128, 12, 125, 147, 123, 385/101, 126, 14, 39, 11, 122, 2, 16; 427/162, 581, 596; 419/27; 438/287, 438/591; 257/410, E21.12, E21.25, 257/E21.127, E21.272, E21.274, 4, 257/E31.093, E27.129, E31.038; 428/323, 428/328, 402, 558, 545, 549, 560, 567, 614, 428/924, 605, 374, 542.8, 373; 65/393, 65/442, 389, 385; 264/1.24, 171.13, 1.29, 264/164, 288.4, 291, 323
See application file for complete search history.

(56) References Cited

U.S. PATENT DOCUMENTS 7,292,758 B2 * 11/2007 Bayindir et al. ............... 385/101
2005/0036731 A1 * 2/2005 Maxwell ......................... 385/16
(Continued)

OTHER PUBLICATIONS

Deng et al., "In-Fiber Semiconductor Filament Arrays," Nano Letters, vol. 8, No. 12, pp. 4265-4269, Published online Oct. 29, 2008.
(Continued)

*Primary Examiner* — Jennifer Chriss
*Assistant Examiner* — Altrev Sykes
(74) *Attorney, Agent, or Firm* — Theresa A. Lober

(57) ABSTRACT

In a fiber there is provided a fiber matrix material having a fiber length; and an array of isolated in-fiber filaments that extend the fiber length. The in-fiber filaments are disposed at a radius in a cross section of the fiber that is a location of a continuous filament material layer in a drawing preform of the fiber. As a result, there is provided a fiber matrix material having a fiber length; and a plurality of isolated fiber elements that are disposed in the fiber matrix, extending the fiber length, where the plurality is of a number greater than a number of isolated domains in a drawing preform of the fiber.

27 Claims, 7 Drawing Sheets

(51) Int. Cl.
*H01L 31/08* (2006.01)
*H01L 31/09* (2006.01)
*G02B 6/02* (2006.01)
*G02B 6/036* (2006.01)

(52) U.S. Cl.
CPC ......... *H01L 31/095* (2013.01); *G02B 6/02366* (2013.01); *G02B 6/03694* (2013.01); *Y02E 10/50* (2013.01); *Y10T 29/49801* (2015.01); *Y10T 428/2931* (2015.01)

(56) References Cited

U.S. PATENT DOCUMENTS

2005/0053345 A1* 3/2005 Bayindir et al. .............. 385/123
2007/0245774 A1 10/2007 Dutta
2009/0028488 A1 1/2009 Monro et al.

OTHER PUBLICATIONS

Deng et al., "Processing and properties of centimeter-long, in-fiber, crystalline-selenium filaments," Appl. Phys. Letts., vol. 96, pp. 023102-1023102-3, Published online Jan. 11, 2010.

Deng et al., Well-ordered semiconductor wire-arrays driven by in-fiber capillary layer breakup, Nanotechnology 2008: Microsystems, Photonics, Sensors, Fluidics, Modeling, and Simulation-Tech. Proc. of the 2008 NSTI Nanotechnology Conf. and Trade Show, vol. 3, pp. 26-27, Boston, MA, Jun. 1-5, 2008.

Deng et al., "Novel fabrication and enhanced photosensitivity of semiconductor nanofilament arrays by optical-fiber thermal drawing," Proceedings of Conference on Lasers and Electro-Optics, CLEO.2009.CFH1, Baltimore, MD, May 31-Jun. 5, 2009.

Deng et al., Novel fabrication and optoelectronic property of semiconductor filaments by optical-fiber thermal drawing, Proc. SPIE 7402, Nanoengineering: Fabrication, Properties, Optics, and Devices VI, 740204, San Diego, CA , Aug. 20, 2009.

* cited by examiner

IN-FIBER FILAMENT PRODUCTION

CROSS-REFERENCE TO RELATED APPLICATION

This application claims the benefit of U.S. Provisional Application No. 61/279,857, filed Oct. 27, 2009, the entirety of which is hereby incorporated by reference.

STATEMENT REGARDING FEDERALLY SPONSORED RESEARCH

This invention was made with Government support under Contract No. W911NF-07-D-0004 awarded by the Department of Defense, under Contract No. DMR-0213282 awarded by the NSF, and under Contract No. DMR-0819762awarded by the NSF. The Government has certain rights in the invention.

BACKGROUND OF INVENTION

This invention relates generally to filaments, and more particularly relates to the design and fabrication of submicron scale filaments formed of microfabrication materials such as metallic and semiconducting materials.

Interest in the production of metal and semiconductor filaments, and filaments of microfabrication materials in general, of submicron dimensions, is rapidly growing as applications in, e.g., mesoscopic physics and nanoscale systems, proliferate. Metal and semiconductor filaments provide an ability to integrate electrical interconnects and functional elements into electronic, optoelectronic, and electromechanical devices and systems in the submicron and nano-scale regimes. A wide range of MEMS and nano-scale systems cannot be fully realized without integration of such filament elements in the systems.

Historically it has been quite challenging to synthesize metal and semiconductor filaments with a high degree of control over filament morphology and dimensions. Solution-phase, vapor-phase, and vapor-liquid-solid (VLS) filament growth techniques, among others, have all been proposed. In particular, VLS filament growth has emerged as an important method for the fabrication of high-quality semiconductor filaments. But semiconductor filaments produced by processes such as conventional VLS growth are inherently limited to micrometer-length scales, are characterized by extreme mechanical fragility, and lack global orientation.

One application for metal and semiconductor filaments, namely, integration in optical fibers, cannot generally be realized by conventional VLS or other such growth techniques. Several attempts have been made to embed submicron filaments into optical fibers with methods such as high-pressure chemical vapor deposition, pumping-and-filling techniques, and multiple-step, draw-cut-stack methods. But the orders-of-magnitude disparity between typical fiber dimensions and filament dimensions has posed severe challenges to the successful implementation of these techniques.

SUMMARY

The invention overcomes the challenges and limitations posed by conventional techniques for the production of sub-micron-scale filaments. In one filament, there is provided a fiber matrix material having a fiber length; and an array of isolated in-fiber filaments that extend the fiber length. The in-fiber filaments are disposed at a radius in a cross section of the fiber that is a location of a continuous filament material layer in a drawing preform of the fiber. As a result, there is provided a fiber matrix material having a fiber length; and a plurality of isolated fiber elements that are disposed in the fiber matrix, extending the fiber length, where the plurality is of a number greater than a number of isolated domains in a drawing preform of the fiber.

For producing a fiber, there is provided a fiber drawing preform. The fiber drawing preform includes a fiber matrix material and a continuous layer of filament material disposed with the fiber matrix material in a preform assembly geometry corresponding to a drawn fiber arrangement of the fiber matrix material and an array of isolated in-fiber filaments of the filament material. In a further fiber drawing preform, there is provided a fiber matrix material and a filament material layer having first and second faces and arranged with the fiber matrix material adjacent to each of the first and second faces in a preform assembly. The filament material layer is characterized by a thickness and a viscosity that enforce breakup of the filament material layer into an array of in-fiber filaments during drawing of the preform assembly into a fiber of the matrix material and the filament material.

With these fibers and fiber preforms, there is provided a method for producing a fiber. In the method, a fiber preform is assembled including a filament material layer having a characteristic filament material viscosity and having a filament material layer thickness and a fiber matrix material adjacent to each face of the filament material layer. The preform is drawn into a fiber such that for the filament material viscosity and filament material layer thickness the filament material layer breaks up into an array of isolated in-fiber filaments extending a characteristic fiber length.

With these fibers and fiber draw process, in-fiber filaments can be produced in a high-throughput and low-cost fashion by a fiber draw process that can be precisely and reproducibly controlled. The filaments are produced as an in-fiber array of filaments that are well-ordered with parallel alignment, and the filaments are protected in the encapsulating matrix material of the fiber, thereby enabling manual manipulation until a need to extract filaments should arise. The challenges posed by the fragility of nanostructures in general during handling are therefore eliminated. A wide range of electronic, optoelectronic, and sensing applications are well-addressed by the in-fiber filaments. Other features and advantages will be apparent from the following description and accompanying figures, and from the claims.

DETAILED DESCRIPTION

Figure 1A:
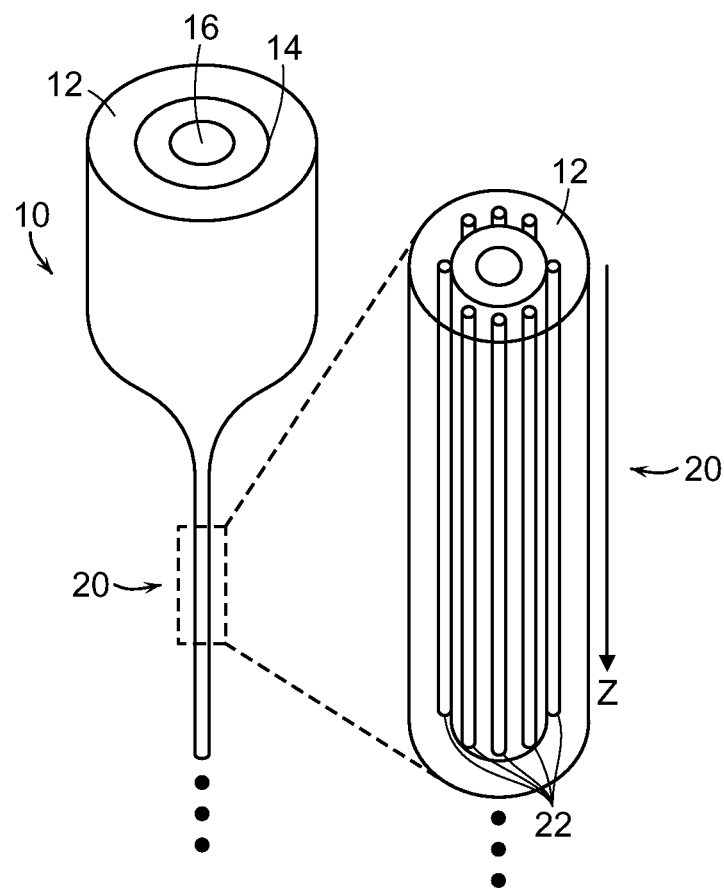
FIGS. 1A-1B are schematic perspective views of a fiber preform and fiber including in-fiber filaments, and a fiber including in-fiber filaments and extracted filaments, respectively, for an example filament production process.
Figure 1B:
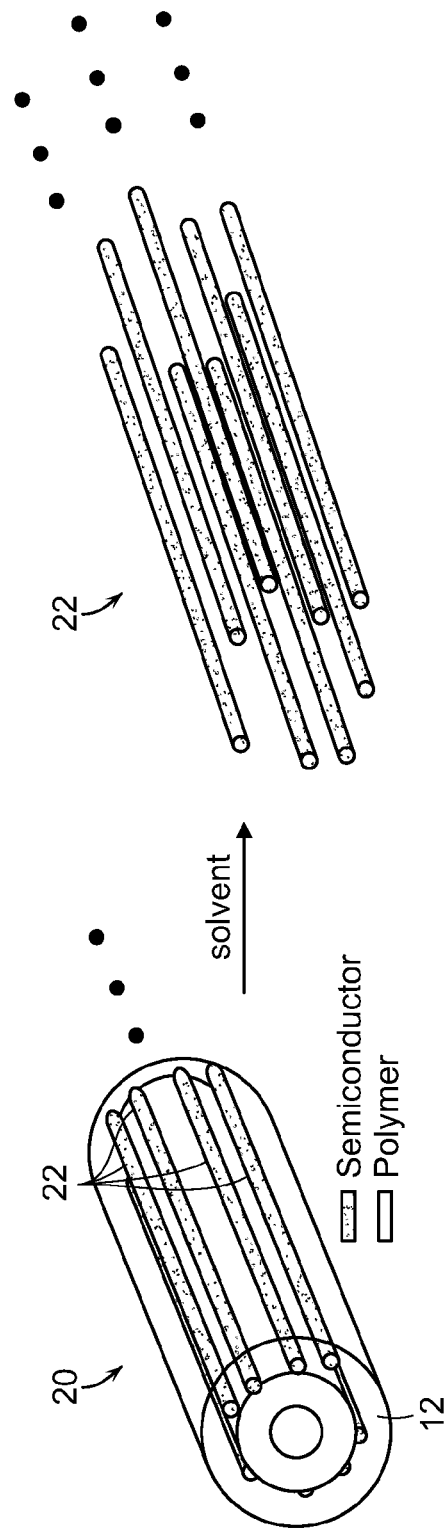
Figure 2:
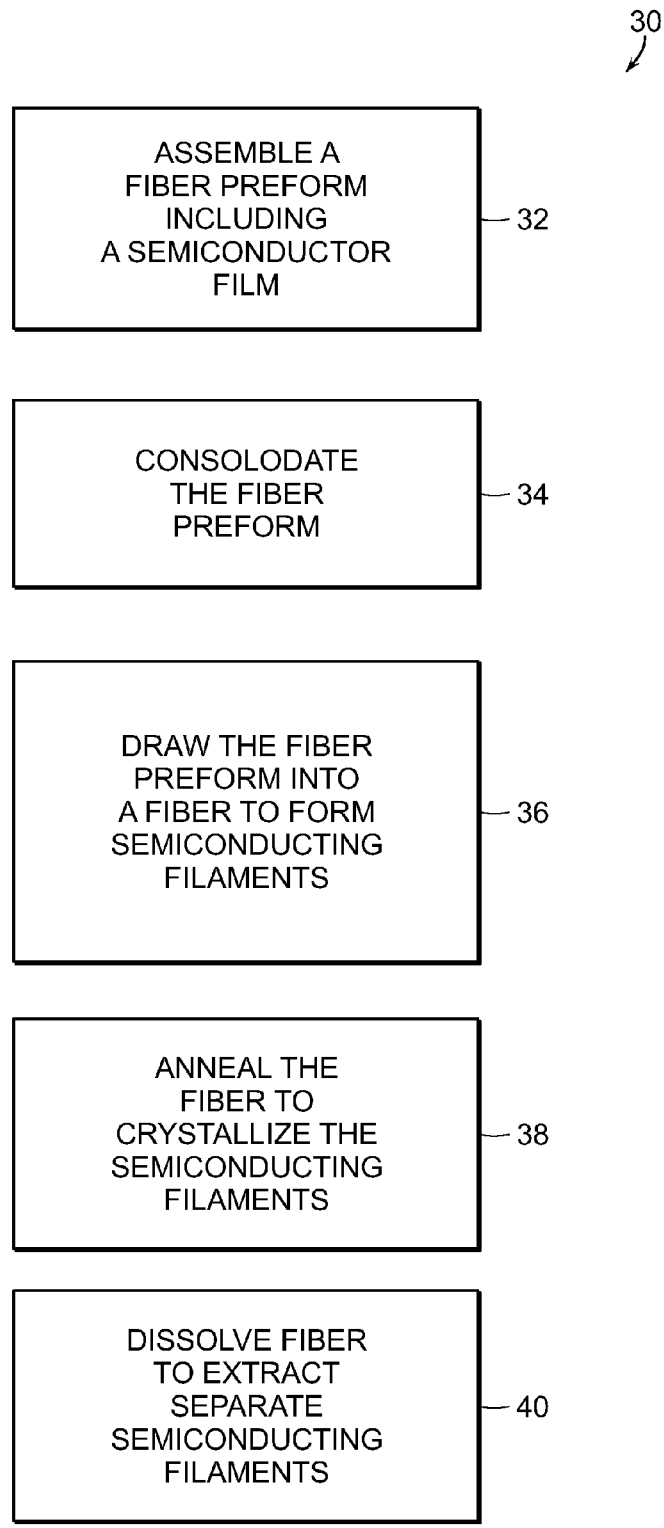
FIG. 2 is a flow chart of steps in a method for producing in-fiber and filaments and filaments extracted from a fiber.

Referring to FIGS. 1A-1B and the flow chart of FIG. 2, there can be produced in-fiber, submicron-scale filaments by a filament fabrication method 30. In the method, and as schematically shown in FIG. 1A, there is first assembled 32 a fiber preform 10 that includes selected materials arranged in a macroscopic geometric configuration corresponding to the desired geometry of a fiber 20 to be drawn from the preform, including filaments 22 that are to be produced in the fiber by the drawing process, as explained below. The preform can include, e.g., a fiber matrix material 12 and other materials that are to form regions of the drawn fiber 20 around in-fiber filaments. The preform specifically includes a layer or layers of a material 14 that is to form the desired filaments 22 in the fiber by the drawing process. Other regions of the preform can be arranged as-desired; for example including a hollow core 16 or other core composition as described below. The preform can include electrically conducting, semiconducting, and insulating materials. The preform is characterized by a ratio of longitudinal to cross sectional dimensions that is typically between about 2 and about 100.

Once assembled, the preform can be consolidated in a next process step 34. The consolidation process, carried out under selected temperature and pressure conditions as described below, is employed when necessary for producing intimate material interfaces in the preform to ensure production of filaments in the drawn fiber. The preform 10 is then drawn 36 into a fiber 20 of an extended length, on the order of meters or more. During the drawing process, as explained in detail below, an ordered array of filaments 22 is produced in the fiber, circumferentially at a radius in the fiber cross section, from the layer or film 14 that was correspondingly provided in the fiber preform specifically to form the filaments.

The drawn fiber is a three-dimensional, unsupported object for which one dimension, defined as the longitudinal dimension, is substantially larger than the other two dimensions, defined as the cross-sectional dimensions. The longitudinal length of the fiber is on the order of meters, e.g., 10 m, 20 m 50 m, 100 m, or longer, with a diameter on the order of between about 50 microns and about 2000 microns, resulting in a longitudinal-to-cross sectional ratio that can be above 1000, a length that can be more than 100 times greater than that of the preform, and a diameter that can be 10 times less than the diameter of the preform.

Once fiber drawing is completed, then the method of FIG. 2 can be continued with a step of annealing 38, if needed and/or desired, to crystallize each in the ordered array of filaments if the filaments are not crystalline as-drawn. Then, as shown in FIG. 1B, if desired, the in-fiber arrangement 20 of the filaments can be dismantled, e.g., with a suitable solvent, to dissolve 40 the fiber matrix 12 of the fiber to extract the filaments 22 and produce filaments that are each freely distinct. The filaments can therefore be employed in-fiber, as an ordered array that is encapsulated in the fiber, or can be employed individually or in a bundle after extraction from the fiber.

The in-fiber filament production method is based on a fluid-instability phenomenon whereby a designated film or layer 14 of the fiber preform spontaneously evolves, or breaks up, into a periodic array of filaments in which each filament is isolated from the others in the array, as the thickness of the film reduces during the fiber drawing process. This structural evolution of the preform film of filament material occurs exclusively in the cross-sectional plane of the fiber, while uniformity of the filament material is maintained along the longitudinal axis of the fiber, thereby producing continuous, uniform filaments along the length of the fiber. The rapid evolution of the filament material layer in the preform to an array of filaments that are isolated from each other is captured in a frozen state by the thermal drawing process.

During the drawing process, as the fiber preform is heated, the materials of the preform, including the film 14, become viscous. When the thickness of the film in the preform drops below a characteristic length scale, i.e., is thinner than a threshold thickness that is determined by the viscosity of the film and that of the material or materials adjacent to surfaces of the film, and due to the surface energy of the materials, the film spontaneously breaks up into the ordered array of filaments 22 in the drawn fiber 20.

Figure 3:
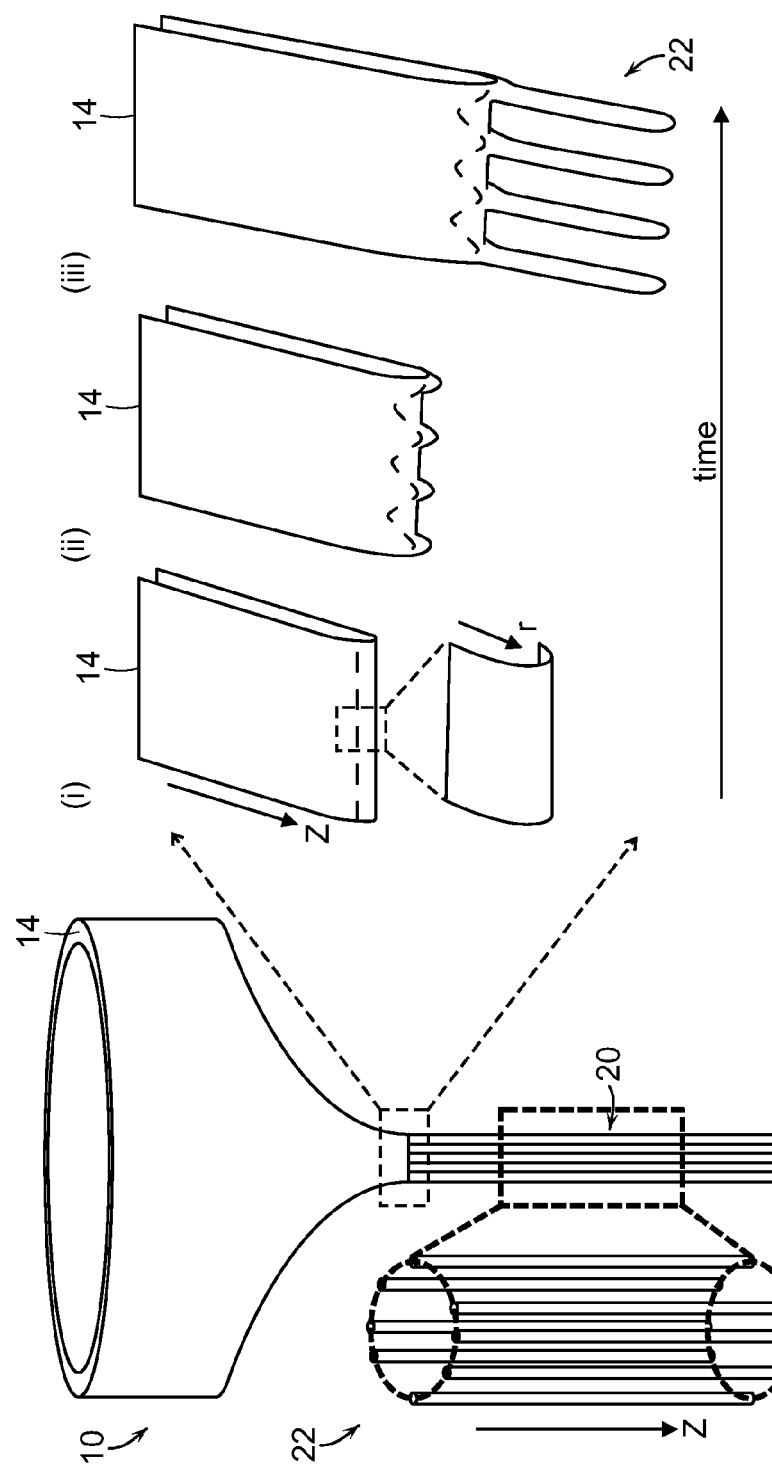
FIG. 3 is a schematic perspective view of a fiber preform evolving into a fiber including in-fiber filaments, illustrating the evolution of a preform layer into an array of in-fiber filaments.

Without being bound by theory, it is understood that this spontaneous formation of filaments during the fiber draw is due to a fluid-front instability mechanism. Referring to FIG. 3, as the preform is drawn into a fiber, the matrix material of the preform tends to deform such that at the start of the draw, only the matrix material is located in the high-temperature draw zone where the preform deforms in the viscous state. At this time, the filament material layer that is to produce the filaments is outside the high-temperature draw zone. Then as the drawing proceeds, the part of the preform containing the filament material layer is gradually fed into the high-temperature zone and a viscous interface is formed between the matrix material and the filament material layer.

As shown in FIG. 3, it can be assumed that this interface has a curved fluid front in the transverse direction, developing a smooth curved ridge due to interfacial tension, with a radius of curvature, r, that is approximately half of the filament layer thickness, h, such that $r \sim h/2$. A capillary instability develops on this curved front where small initial perturbations grow rapidly into protrusions. These protrusions extend into isolated filaments 22 along the longitudinal axis as the preform passes into the high-temperature zone. The isolated filaments 22 that are thereby formed in a circumferential array at a radius in the fiber cross section subsequently freeze in place as the fiber 20 emerges from the high-temperature draw zone and cools.

The resulting in-fiber filaments are each of a geometric structure that is dictated by the thickness of the preform layer from which they originated and the size of the resulting filaments. For example, the filaments can be ribbon-like three-dimensional structures, having a thickness less than about 500 nm, and having a width set by the separation of the filaments around the fiber circumference. The filaments can also be more circular in nature, corresponding to a one-dimensional structure. Whatever the filament cross-section, the filaments have a length corresponding to the length of the drawn fiber, which can be tens of meters. The term "diameter" can therefore be applied to the largest extent across the cross section of a filament. The filaments are separated from each other circumferentially by the fiber matrix material.

A simple estimate of the diameter, or thickness, of each in-fiber filament can be obtained based on conservation of volume arguments. For a given fiber length, the area of a filament cross section can be equated to the initial thickness of the preform filament material layer arranged for producing the filament array divided by the draw-down ratio, which would be the film thickness in the fiber in the absence of filament production, times the distance between filaments, as:

$$\lambda, \pi D^2/4 \sim \lambda(h/z) \tag{1}$$

where D is the filament diameter, h is the initial preform film thickness, z is the preform-to-fiber draw-down ratio, and λ is the instability wavelength. For example, given an initial film thickness of 200 nm and a fiber draw-down factor of 20, then h/z~200/20 nm, and given λ~3 µm, an assumption made from experimental evidence, the filament diameter, or thickness, is estimated to be approximately 200 nm.

In general, the filament diameter is determined by the initial film thickness in combination with the viscosity and surface tension of the filament material layer, the fiber matrix material, and the draw-down ratio. A linear theory of capillary instability, such as the classic Rayleigh and Tomotika models, states that a capillary instability growth rate, σ, is proportional to the interfacial tension, γ, between adjacent layers, and is inversely proportional to the viscosity, η, of a given layer, as well as the layer thickness, h. Therefore, for any given material system, relatively thinner layers are characterized by shorter instability time, corresponding to a large filament growth rate; and are therefore relatively more unstable during fiber drawing. One might expect that surface tension should result in the in-fiber filaments breaking up axially into droplets. However, axial tension and viscous boundaries are understood to contribute to stabilizing filaments, leading to a time scale for axial breakup of the filaments that is longer than that of circumferential breakup.

The in-fiber filament production process provides a range of advantages. First, the filaments produced by the process have unprecedented length, in principle extending along the entire tens-of-meters-long fiber that can be produced by the fiber draw process. A typical layer of filament material for production of filaments can be provided in a preform as a preform layer that is about 10 cm-long, about 3 cm-wide, and several nanometers in thickness, as explained below. From this preform, forty meters of fiber including in-fiber filaments can be produced with a draw-down scaling factor of 20. Given that about 100 filaments can be produced in a fiber from a corresponding filament material layer in the fiber preform layer, then hundreds of meters-long filaments can be produced from a single filament material layer that is clad in a fiber preform. This is due to the transition in dimensionality from a 2-D preform layer to an array of substantially 1-D in-fiber filaments that the filament production process accomplishes.

In addition, the filament production process aligns all of the filaments in the fiber in a common global orientation as an in-fiber array of filaments having an array orientation. Further, the mechanically-tough matrix of the fiber hermetically seals the filaments into a structure that can be macroscopically manipulated without harm to the filaments and without destruction of the filament array orientation, thereby overcoming many of the problems associated with handling of nanostructures. The filament array can thereby be easily incorporated into a micro-scale system. Alternatively, the filament array can be extracted from a fiber for manipulation of individual filaments in the array.

The filament production method is compatible with a wide variety of filament materials into which filaments can be produced, including metals, semiconductors, piezoelectrics, and other suitable materials. More than one filament material layer can be included in a fiber preform, and each in a plurality of filament material layers can be provided as a distinct composition. For example, a semiconducting preform material layer can be included for producing semiconducting filaments and a metallic preform material layer can be included for producing metallic filaments. Whatever filament material or materials are selected, it is required that the matrix material and the filament material layers be compatible for co-drawing into a fiber. Requirements and examples of suitable arrangements for co-drawing of such material combinations are given in U.S. Pat. No. 7,295,734, issued Nov. 13, 2007, U.S. Pat. No. 7,292,758, issued Nov. 6, 2007, and U.S. Pat. No. 7,805,029, issued Sep. 28, 2010, the entirety of all of which is hereby incorporated by reference.

In general, materials that are amorphous and glassy are particularly well suited to be co-drawn from a preform into a fiber structure. The term "amorphous" here refers to a material morphology that is a continuous atomic network in which there is no repeating unit cell or crystalline order; a glassy material typically is not easily crystallized at high processing temperatures. For many applications, it can be preferred to select a fiber matrix material and a semiconducting material, where formation of in-fiber semiconductor filaments is desired, that are both glassy to enable fiber drawing at a reasonable speed while self-maintaining structural integrity and regularity. Such can be achieved with glassy materials because the viscosity of a glassy material varies quasi-continuously between solid and liquid states, in contrast to a crystalline material.

For many applications it can be preferred that the fiber matrix material be electrically insulating so that the filaments in the fiber are electrically as well as structurally isolated from each other. Where the filaments are to be formed of a semiconducting material, candidate glassy semiconducting and insulating materials are those having compatible viscosities at the fiber drawing temperatures of interest. More specifically, the materials should both be above their respective softening points at an overlapping draw temperature to enable their co-drawing, and therefore should flow at that draw temperature. Suitable materials additionally are preferably characterized by good surface adhesion and wetting in the viscous and solid states without cracking even when subjected to thermal quenching.

Thermoplastic polymeric insulating materials, and amorphous thermoplastic polymeric insulating materials in particular, are well-suited as the fiber matrix material. High glass-transition-temperature polymeric insulators are an example of such; a wide variety of high glass-transition-temperature polymer materials are available and can be processed with a range of techniques to form various material configurations that are characterized by excellent mechanical toughness. Examples of high glass-transition-temperature polymers that can be employed as a fiber matrix include poly-ether imide (PEI), poly-sulfone (PSU), poly-ether ether ketone (PEEK), and poly-ether sulfone (PES).

There also can be employed as a fiber matrix material liquid crystal polymers (LCP's), low glass transition polymers such as poly-methyl methacrylate (PMMA), polycarbonate (PC), poly-ethylene (PE) and other such thermoplastic polymers. Poly-tetrafluoroethylene (PTFE or Teflon™) and other fluorinated polymers or copolymers can also be employed in configurations in which their characteristically poor surface adhesion properties can be accommodated. While it is preferred that amorphous polymer materials be employed, it is also recognized that some semicrystalline polymers, e.g., branched PTFE, can be employed. A necessary condition for any suitable polymeric material is that there exist a fiber draw temperature at which the polymer can be drawn into a fiber at a reasonable speed, e.g., greater than about 1 mm/minute, without decomposition.

Amorphous semiconductor materials are preferred for the semiconductor preform layer that is to produce semiconductor filaments, given the low glass transition temperature and stability with respect to oxidation of amorphous semiconductors. Amorphous semiconductors are also preferred for their good wetting properties, defined by the contact angle between the semiconductor and polymer materials at the draw temperature; a contact angle of less than about 150 degrees can be preferred.

The class of semiconducting chalcogenide glasses are particularly well-suited to the formation of in-fiber semiconductor filaments. Chalcogenides are high-index inorganic glasses that contain one or more of the chalcogen elements of sulfur, selenium, and tellurium. In addition to the chalcogen element, chalcogenide glasses can include one or more of the following additive elements: boron, aluminum, silicon, phosphorus, sulfur, gallium, germanium, arsenic, indium, tin, antimony, lithium, thallium, lead, bismuth, cadmium, lanthanum, and the halides fluorine, chlorine, bromide, and iodine. There is a very wide variety of different compositions within the family of chalcogenide glasses and thus the properties of a given composition can be tailored through compositional adjustment. For example, a composition of $As_xSe_{1-x}$, $AsS$, $(As_{40}Se_{60})_{1-x}Sn_x$, or other combination of the chalcogen elements and additive elements listed above can be employed to obtain a desired characteristic.

Where it is desired to form metallic in-fiber filaments, a conducting material can be selected based on its compatibility for co-drawing with a selected fiber matrix material. Given a selection of a high glass-transition-temperature polymeric insulating material, then a low melting-temperature metal or metal alloy having a melting temperature less than the polymer drawing temperature can be a preferable conducting material selection. For example, tin, indium, bismuth, cadmium, lithium, or other low melting-temperature metal is particularly well suited, as well as Sn-based or other selected alloys. In addition, a selected metal alloy can be synthesized to provide desired melting temperature, electrical conductivity, and other properties. For example, Sn—Ag, Sn—Sb, Sn—Cu, and other alloys can be employed. Further, there can be employed suitable amorphous glassy metals, or other suitable metal composition.

As stated above, there can be included in a fiber preform material arrangements for two or more filament arrays, as well as for additional fiber elements. There can be included metallic, semiconducting, and insulating materials in any preform arrangement desired for drawing into a fiber having a corresponding filament array and other semiconducting, conducting, and/or insulating fiber elements.

With these considerations and examples, it is to be understood that some experimental verification may be required to confirm the co-drawing compatibility of various candidate materials. Once the drawing temperature of each material of interest is determined, and assuming that the materials can be drawn within a common temperature range, it can be prudent to examine the viscosities of the materials across the selected drawing temperature range to ensure that the viscosities are compatible. As stated above, it is not required that the viscosities of the various materials be the same at the fiber draw temperature, but rather that all materials should at least flow at the draw temperature, with conducting materials preferably molten at the draw temperature. Also, as stated previously, it is understood that it can be preferred that the material which comprises the majority of the volume of the fiber preform be characterized by the highest viscosity.

Figure 4C:
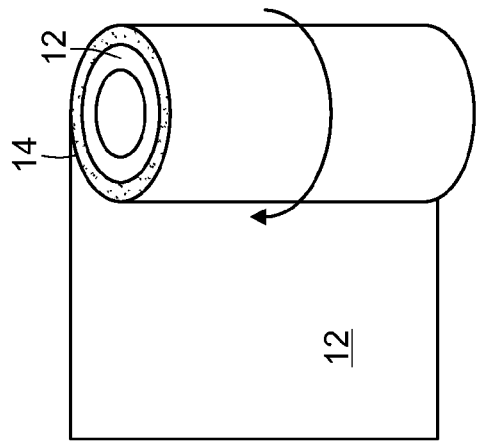
FIGS. 4A-4C are perspective views of semiconductor and polymer materials at three stages of configuration of an example fiber preform with the semiconductor and polymer materials.
Figure 4B:
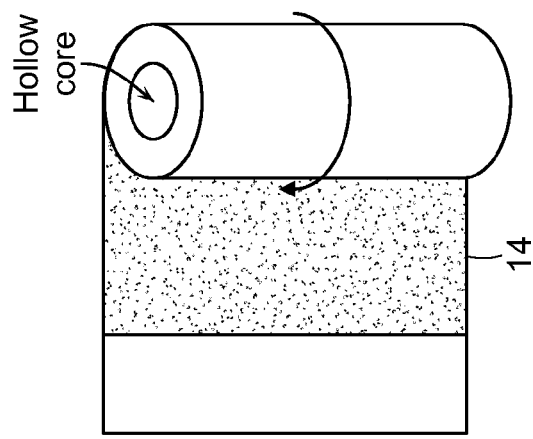
Figure 4A:
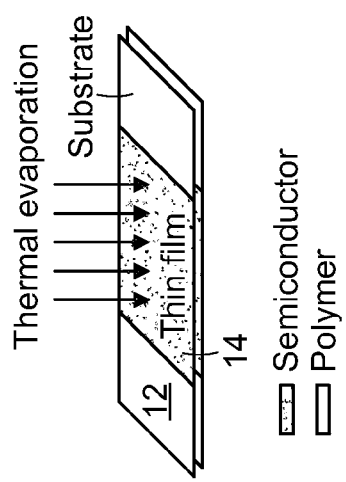

Assembly of materials into a fiber preform is carried out employing processes that are compatible with the selected materials to produce one or more preform layers for formation of in-fiber filaments. No particular preform assembly technique is required. Referring to FIGS. 4A-4B, in one example process for producing a preform to be employed in the production of in-fiber filaments, a material layer 14 of a desired thickness is thermally evaporated onto a substrate of a selected amorphous polymer matrix material 12. The resulting bilayer film is then wrapped around a tube of an amorphous polymer material, or around a mandrel, as shown in FIG. 4B for producing a hollow fiber core. Additional layers of an amorphous polymer material 12 can then be rolled around the structure as polymer fiber cladding as shown in FIG. 4C.

Alternatives to this preform assembly process can be employed. Any suitable thermal evaporation, electron beam evaporation, sputtering, chemical vapor deposition (CVD) or other physical deposition technique can be employed for producing a preform layer that is to become in-fiber filaments. It is recognized that for many applications, thermal evaporation of a synthesized source material onto a polymer film can be a particularly convenient deposition techniques. Foils, sheets, or other structures further can be employed as the preform layer.

In preparation of the preform layer that is to become in-fiber filaments, the layer thickness is selected in tandem with the viscosity of the layer and of the materials adjacent to the layer to cause the formation of in-fiber filaments during the fiber draw. For a given filament material layer viscosity, there exists a characteristic threshold material layer thickness below which the preform layer will evolve into isolated filaments during a fiber draw process. This characteristic threshold thickness can be determined for a given filament material layer by, e.g., empirical experiment with a range of thicknesses. Further, for a given filament layer thickness, there exists a characteristic material viscosity at which the thickness will evolve into isolated filaments during a fiber draw. Thus, a relatively low-viscosity film has a greater tendency to break up into filaments at thicknesses larger than that characteristic for relatively high-viscosity films. For example, a filament material layer of Se, of relatively low viscosity, will evolve into a filament array when the Se layer is less than about 2 microns in thickness, while a filament material layer of $As_2Se_3$, of relatively higher viscosity, will evolve into a filament array only when the $As_2Se_3$ layer is less than about 200 nm in thickness. Thus, for a selected filament material layer viscosity, there is provided a filament material layer that will evolve into an array of filaments during fiber drawing based on the material viscosity. This consideration applies to any material that is employed for the filament material layer, including metallic, insulating, semiconducting, or other material. There is no limitation on the class of material employed for the filament production. All that is required is the ability to co-draw the filament material layer with a fiber matrix material.

Figure 5:
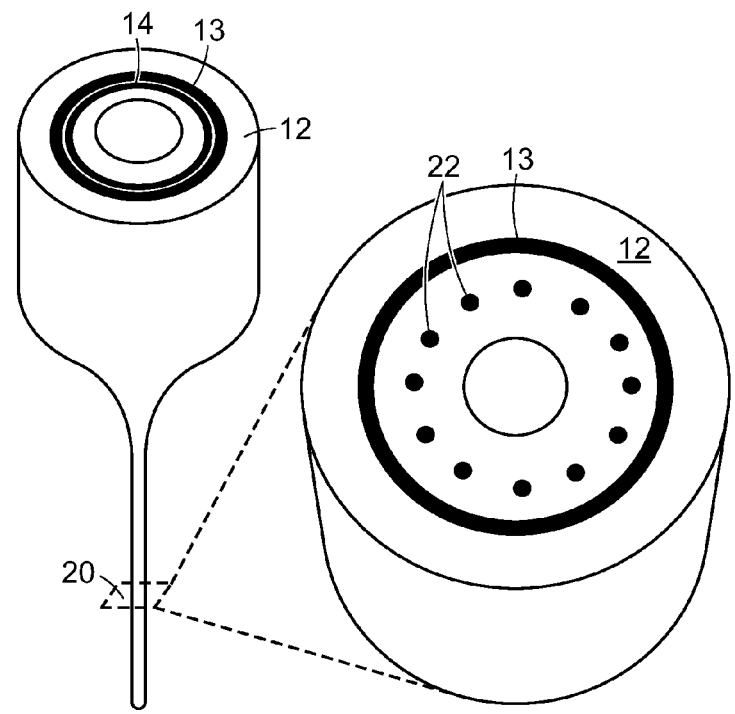
FIG. 5 is are schematic perspective view of a fiber preform including multiple preform layers and the evolution of the preform into a fiber including in-fiber filaments and fiber layers.

In addition to the preform material layer for producing in-fiber filaments, any number of additional elements can be included in the preform to produce a fiber having corresponding elements such as semiconducting, insulating, and conducting elements or any combination of the three, as discussed above. It is not required to provide only a single layer of material that will develop into filaments during the fiber draw process. For example, as shown in FIG. 5, a preform can include a first layer 13 and a second layer 14 along with a fiber matrix material 12 and other elements that are not shown here, for clarity. The materials and thicknesses of the layers 13, 14 can be selected such that after fiber drawing, the first layer 13 maintains its continuity as a fiber film but the second layer 14 breaks up into filaments 22 in the fiber during the fiber draw process. In this way, a range of fiber elements can be incorporated into the preform arrangement in any suitable manner for producing a corresponding fiber that includes an array of filaments along with other non-filament fiber elements. Conducting, semiconducting, and insulating elements all can be incorporated into the preform for co-drawing in the manner described in U.S. Pat. No. 7,295,734, issued Nov. 13, 2007, referenced above and incorporated by reference herein.

With a preform fully assembled, it can be preferred to thermally consolidate an assembled preform prior to the fiber drawing process. Consolidation is a process whereby under heat and vacuum conditions one or more of the preform materials are caused to fuse together, with air pockets in the preform being substantially eliminated. This results in a preform assembly that can produce intimate interfacial contact between adjacent material layers in the final fiber.

The specific conditions of the consolidation process are selected based on the particular materials incorporated into a given preform. If, e.g., a high glass-transition-temperature polymer is employed as a matrix in the preform, then the consolidation temperature preferably is above the glass transition temperature of the polymer. The preform is maintained at the elevated temperature for a time sufficient to cause the polymer to fuse to adjacent elements included in the preform; the temperature is selected based on the preform diameter and its materials. For example, given a preform including a PES polymer matrix and an $As_2Se_3$ semiconducting layer or a Sn metal layer, a consolidation temperature of between 250° C.-280° C., e.g., about 260° C., at a pressure of about $10^{-3}$, sufficiently consolidates the structure.

It can be preferred to carry out the consolidation process in a vertical rotating zone refinement furnace. In such a furnace, the preform longitudinal axis is held vertically and a zone refining heating process is carried out along the preform length. Preferably the consolidation is conducted from the preform bottom upward through the preform to its top. The heating time for each incrementally consolidated preform section along the preform length is determined based on the preform diameter and material elements as explained above.

In construction of a preform there can be included one or more sacrificial elements that are incorporated in the preform solely to define spaces to be provided in a final fiber geometry. For example, a mandrel, rod, or tube can be included in a preform where a hollow fiber core or other region is desired. If a sacrificial element is included in a preform, it is preferred that the consolidation process be carried out at a temperature below the glass transition temperature of that element, so that structural integrity of the sacrificial element is maintained during the consolidation process and the preform does not collapse on itself.

Once a preform has been consolidated, if necessary, and sacrificial elements removed from the preform, drawing of the preform into a fiber with in-fiber filaments can proceed. Fiber drawing can be carried out in a fiber draw tower or other suitable draw apparatus. In such an apparatus, a top preform downfeed mechanism is provided for holding an end of the preform and lowering the preform into a furnace. It can be preferred to employ a vertical draw furnace enabling three temperature zones, namely, top, middle, and bottom temperature zones. Below the furnace is provided a capstan with spooler for spooling the drawn fiber. Measurement equipment, e.g., a laser diameter monitor, from Beta LaserMike, Dayton, Ohio; fiber tension measurement devices, e.g., Model SM9649P, from Tension Measurement, Inc., of Arvada, Colo., and other monitoring equipment can be included.

The draw furnace temperature zones, preform downfeed speed, and capstan speed are selected based on the preform materials and configuration to enable co-drawing of preform conducting, semiconducting, and insulating material elements into a desired fiber configuration including in-fiber filaments. The top furnace zone temperature is selected to cause the preform materials to soften but not flow. The middle furnace zone temperature is selected as the draw temperature, to cause the preform to flow into a fiber form. As explained above, the draw temperature is selected to be above the glass transition temperature of insulating and semiconducting materials, and for most material combinations, will be above the melting temperature of the conducting material. If an excessively high draw temperature is employed, the preform will catastrophically deform, while an excessively low draw temperature will cause preform distortion and expansion. The structural arrangement of the preform must be preserved at the draw temperature.

It is therefore to be recognized that some experimental testing of draw temperatures can be required for a given preform assembly. As explained above, a reasonable criterion for polymer, metal, and chalcogenide material draw temperatures is that all materials have a viscosity lower than about $10^8$ Poise at the draw temperature and that the metal be molten at the draw temperature. Given a preform of PES polymeric insulating elements and a $As_2Se_3$ semiconducting layer or a Sn conducting layer, a top zone temperature of between about 180° C.-250° C., e.g., 190° C.; a drawing zone temperature of between about 280° C.-315° C., e.g., 300° C.; and a bottom zone temperature that is unregulated, and therefore at, e.g., about 100° C., due to proximity to the draw zone, can be employed for successfully drawing the preform into a fiber including in-fiber filaments.

For many applications, it can be preferred to ensure uniform heating of the preform during the drawing process. A uniformly heated furnace employing, e.g., distributed filament heating, is particularly well suited for the drawing process. It is further preferred that the preform be maintained laterally centrally in the drawing temperature zone. If the preform temperature distribution becomes nonuniform due to lack of furnace temperature control or lateral misalignment of the preform as it passes downward through the drawing zone, there could be produced local preform regions of differing temperature and differing viscosity.

The combination of preform downfeed speed and capstan drawing speed determine the diameter of fiber produced by the drawing process for a given drawing temperature. A diameter monitoring system can be configured in a feedback loop to enable control of, e.g., the capstan speed, by the diameter monitors based on a diameter setpoint and control algorithm. For the drawing furnace zone temperatures recited above for drawing a PES-$As_2Se_3$ or PES-Sn preform of 20 cm in diameter and 30 mm in length, a downfeed speed of between about 0.002 mm/sec-0.004 mm/sec and a capstan speed of between about 0.7 m/sec-3 m/sec produces a fiber of a diameter between about 1200 µm and 500 µm and a length of several hundred meters. As can be recognized, a reduction in draw speed increases the resulting fiber diameter. Within the fiber, layers of the preform are reduced in thickness by a factor of ~20-100. In accordance with the invention, a preform can be drawn multiple times to reduce the final resulting fiber geometry correspondingly.

The draw-down ratio between a fiber preform and the resulting fiber is not precise; specifically, the preform layer thickness drawdown ratio does not always correspond precisely to the fiber's outer diameter drawdown ratio. This can be due to a number of factors, including, e.g., reduction of hollow core or other hollow spaces within the preform. The relationship between the layer and outer diameter drawdown ratios is found to be closer to 1:1 for large-diameter, low-tension draw procedures. High-temperature, low-tension draw procedures can tend to produce fibers having layers thicker than predicted by the outer diameter reduction ratio, due, e.g., to partial collapse of hollow regions. It is found, however, that such effects are fairly reproducible and can be predicted based on experimental history.

With a selected fiber length drawn, there is produced an array of isolated, in-fiber filaments that are regularly spaced around the circumference of the fiber, separated by fiber matrix material, as shown in FIG. 5. Thus, where a continuous material layer 14 existed in the cross section of the fiber preform, there exists in the cross section of the fiber a discontinuous material region composed of isolated filaments. The number of fiber element domains in the fiber cross section is therefore greater than the number of domains that was provided in the corresponding preform for production of that fiber.

After the fiber draw and in-fiber filament formation, the in-fiber filaments can be subjected to a post-drawing annealing step or other suitable process. Such an annealing process can be carried out to crystallize the fiber filaments to a polycrystalline or monocrystalline state. Immediately after thermal drawing, the in-fiber filaments cool rapidly and are quenched into the filament array in an amorphous state of morphology. For filament materials that are glassy and that can easily transition between the amorphous and crystalline states, the filaments can be converted to an equilibrium crystalline state by an annealing step, e.g., a thermal annealing step at 150° C., for a suitable time, e.g., for about one hour. The annealing temperature is preferably substantially below the glass transition temperature of the matrix material included in the fiber. For example, given a PSU fiber matrix material, which is characterized by a glass transition temperature, $T_g$, ~190° C., an annealing temperature of 150° C. ensures that the fiber matrix is unaffected by the annealing. Typically, the transition of filaments embedded in the fiber from the amorphous state to the crystalline state can be readily discerned visually from a dramatic change in filament color. Annealed filaments that have crystallized, at least to a polycrystalline state, generally are dull gray in color.

No particular crystallization process is required; alternative to thermal annealing, crystallization of the filaments may also be induced optically by illuminating sections of an in-fiber filament array. For example, a fiber can be illuminated for two hours with a laser, e.g., a 532-nm laser. The laser power density is preferably maintained at a low level, e.g., below about 10 mW/cm$^2$, in order to minimize heating effects of the fiber matrix material. Other crystallization processes can be employed as-suitable for a given fiber configuration.

For many applications and fiber draw parameters, the in-fiber filaments as-produced by the fiber draw process can be crystalline in nature and therefore not require any post-draw crystallization step. Specifically, if the draw-down ratio of the fiber draw process is set such that the thickness and the width of in-fiber filaments produced by a filament material layer in the preform are less than the average grain size that is characteristic for a given filament material in a polycrystalline state, then single-crystal filaments will be produced by the fiber draw process. This condition can be particularly advantageous where it is required to produce crystalline filaments without an annealing step.

As explained above, the in-fiber filament array can be extracted from the fiber structure by, e.g., dissolving the fiber matrix material. For example, a solvent such as dimethylacetamide can be employed for dissolving a polymer fiber matrix. After release from the fiber structure, the extracted fiber filaments can be individually processed or bundled for use in a selected application.

Figure 6A:
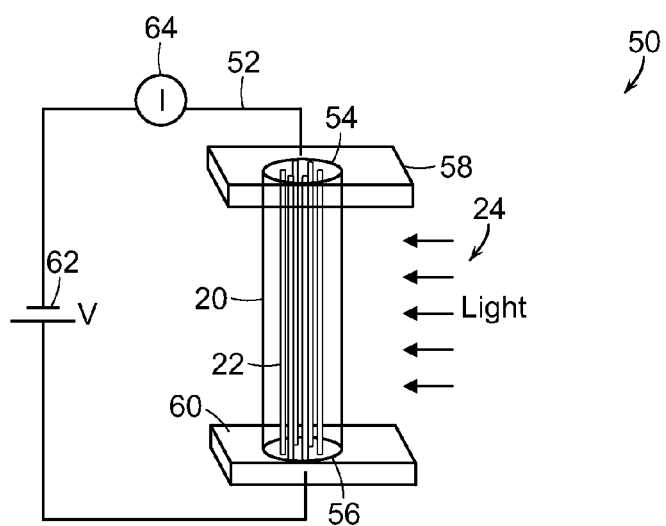
FIGS. 6A-6C are a schematic view of an experimental in-fiber filament photodetector device, the measured current-voltage characteristics of an amorphous in-fiber filament photodetector and a crystalline in-fiber filament photodetector under dark and illuminated conditions, and the current-voltage characteristics of a crystalline in-fiber filament photodetector under cycled illumination conditions, respectively.

For many applications the in-fiber arrangement of filaments can also be advantageously employed. For example, referring to FIG. 6A, there can be produced an in-fiber, crystalline-filament photodetector or optical switch 50. In this photodetector configuration, the matrix material of the fiber 20 is preferably transparent to the illumination wavelength band of interest such that the illumination can penetrate the fiber to reach the filaments. The array of filaments 22 in the fiber 20 is connected to external circuitry 52 by contacting the two fiber ends 54, 56, with an electrical conductor 58, 60, as shown schematically in FIG. 6a, that is connected in the circuit 52, including, e.g., a voltage source 62 and an ammeter 64. For example, silver paint or other conductor can be applied to both ends of a fiber segment and then wrapped with metal wire, and the metal wire contacted in a selected circuit arrangement.

When illumination 24 is directed to the fiber and the in-fiber filament array, the electrical conductivity of the filaments changes in correspondence with the illumination and can be employed to sense the presence and intensity of illumination. In general, it is required that the in-fiber filaments be crystalline to enable this illumination detection. The resistivity of amorphous filaments is in general too large to conduct measurable electric current and therefore cannot operate in a device employing current sensing.

EXAMPLE I

Semiconducting in-fiber filaments were produced by drawing fibers from fiber preforms. A first fiber preform was arranged with layers of PSU as a fiber matrix material and with layers of the amorphous semiconductor Se. A second fiber preform was arranged with layers of PES as a fiber matrix material and with layers of the amorphous semiconductor $As_2Se_3$. These semiconductor and polymer materials in the pairings are have similar thermo-mechanical properties in an overlapping temperature range as well as good adhesion through repeated thermal cycling, both properties of which are preferred for facilitating co-drawing of the two different materials.

In each of the Se-PSU and $As_2Se_3$-PES preforms, four concentric amorphous semiconductor films of gradually smaller thickness were included in the manner shown schematically in FIG. 5, with the outer film being the thickest of the films. For the Se-PSU preform, there were included four Se films of 14 microns, 2, microns, 1.3 microns, and 340 nm in thickness, with a PSU cladding thickness of about 25 microns. For the $As_2Se_3$-PES preform, there were included four $As_2Se_3$ films of thicknesses 5.4 microns, 1.4 microns, 280 microns, and 60 nm, with a PES cladding film thickness of about 25 microns.

To form the semiconducting films in the preforms, the semiconducting material was thermally evaporated onto sheets of polymer, in the manner of FIG. 4A. An additional polymer layer was then provided and the structure rolled around a PTFE mandrel. This arrangement produced preforms measuring about 160 mm in length and 20 mm in diameter.

Each of the preforms was consolidated under vacuum for approximately one hour. The $As_2Se_3$-PES preform was consolidated at a temperature of ~260° C. and the Se-PSU preform was consolidated at a temperature of about 220° C. To draw fibers from the two preforms, there was employed a conventional optical fiber draw tower consisting of a three-zone furnace to heat a preform to the draw temperature. The draw temperature zone was set to ~300° C. for the $As_2Se_3$-PES preform and the draw temperature zone was set to ~260° C. for Se-PSU preform. A feeding process was controlled to introduce a preform into the furnace at a downfeed speed of about 0.003 mm·s$^{-1}$, and a capstan was employed to pull the resulting fiber from the preform, set at ~0.1 m·in$^{-1}$. The drawing parameters were fixed to keep a constant draw-down ratio of about 20 between the feature sizes of the preform and final fiber.

A segment of each resulting fiber was cut from the drawn fibers, and the cross section of each segment was imaged. It was found that the thickest Se preform layer of 14 microns in thickness, did not evolve into a filament array during fiber drawing and was reduced to a continuous layer of about 700 nm in thickness, while the three thinner preform Se layers, of 2 microns, 1.3 microns, and 340 nm in thickness all underwent differing degrees of circumferential breakup during the fiber drawing, producing in-fiber filaments having a thicknesses of 96 nm, 65 nm, and 17 nm, respectively. The thinnest Se layer completely broke up into circular features. The average spacing between the Se filaments around the fiber circumference was found to be linearly proportional to the thickness of the preform layer from which the filaments evolved.

For the $As_2Se_3$-PES preform, all $As_2Se_3$ preform layers having a thickness greater than 10 nm remained intact during the fiber drawing, producing continuous fiber layers of 270 nm, 70 nm, and 14 nm in thickness, with preform layer evolution into filaments occurring only in the thinnest preform layer of 60 nm, producing filaments of 3 nm in thickness.

For these two different fiber materials systems, these results are expected because Se is characterized by a viscosity that is 5 orders-of-magnitude lower than that of $As_2Se_3$. Se layers are therefore more vulnerable to breakup than $As_2Se_3$ layers, as discussed previously.

EXAMPLE II

The axial stability of in-fiber filaments was experimentally investigated. Two preforms were arranged, each including a single Se film of thickness 1 micron and 16 microns and PSU fiber matrix polymer. The preforms were consolidated and drawn following the parameters of Example I. During drawing, the Se filament layer of 1 micron in thickness in the first preform evolved into an array of filaments. In contrast, the Se preform layer of 16 microns in thickness, in the second preform, did not evolve into an array of filaments and evolved into a continuous fiber layer of about 800 nm in thickness.

Axial inspection confirmed extended continuous Se filaments of sub-100 nm-thickness in the first fiber, with well-ordered, isolated, parallel filaments spanning the entire fiber length. The second fiber displayed a continuous Se layer. The reproducibility of the production of extended filaments was confirmed by additional fiber drawings of both Se-PSU and $As_2Se_3$-PES fiber preforms. No axial filament breakup was found to occur, although branching and recombination of filaments can occur if defects or inhomogeneities are present in the corresponding preform layer film, and such is preferably to be avoided.

EXAMPLE III

A preform was configured including a fiber matrix material of PSU and a 200 nm-thick film of Se evaporated in the manner described in Example I.

The preform was consolidated and drawn in the manner of Example I. After drawing, a segment of fiber was cut and imaged with scanning electron microscopy and transmission electron microscopy. The imaging revealed that the Se preform film evolved during fiber drawing into filaments having circular cross section of about 10 nm in diameter and an average circumferential spacing between filaments of about 3 microns. A diffraction pattern taken from one of the filaments demonstrated that the filament was single-crystalline in nature as-drawn. Thus, the fiber draw process was demonstrated to produce single crystal in-fiber filaments as-drawn, with no need for an additional post-draw crystallization step.

EXAMPLE IV

An in-fiber array of Se filaments was produced by drawing a preform that included PSU matrix material and a layer of Se of 2 microns in thickness in the manner of Example II above. The preform was drawn at a temperature of about 260° C. to form a 20 meter-long fiber including an array of in-fiber filaments. The fiber was annealed at a temperature of 150° C. for 1 hour to crystallize the filaments. A second fiber including an in-fiber Se filament array was also formed but was not annealed, to thereby maintain an amorphous filament morphology. A 2 cm-long fiber piece was cut from the annealed fiber and from the un-annealed fiber for configuration of each of the two segments as photodetectors. Silver paint was applied to both ends of each fiber segment and then metal wire was wrapped around the silver-painted ends. The fiber segments were each configured in a circuit as in FIG. 6A.

Figure 6B:
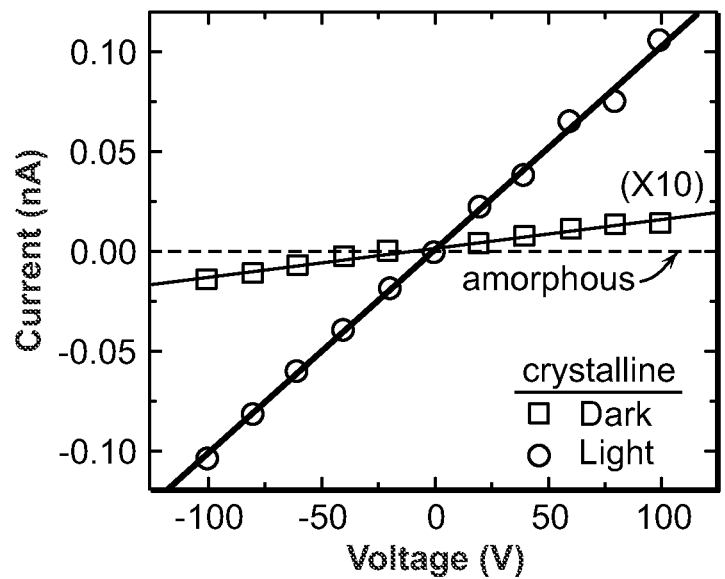
Figure 6C:
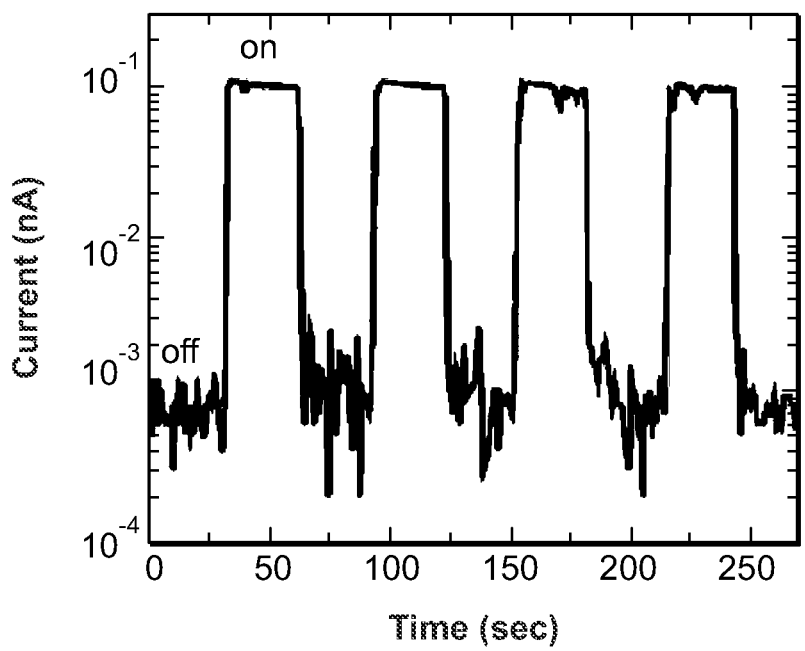

Referring to the plot of FIG. 6B, under an applied voltage bias, the annealed in-fiber filaments displayed ohmic characteristics in both dark and illuminated conditions. But no current was recorded for the amorphous in-fiber filament array, owing to the extremely low electrical conductivity of the amorphous filaments. The measurable current of the crystalline Se filament arrays confirms that there was a continuous path between fiber ends and that the selenium filaments were at least 2 cm in length. As shown in the plot of FIG. 6B, the filament array exhibited enhanced photoconductivity under illumination from a 500 mW/cm$^2$ broadband white-light source. A repeatable two-orders-of-magnitude change in current was measured for the filament array by turning the illumination on and off under fixed applied bias. The measured plot of current response for this illumination cycling is shown in FIG. 6C.

The large difference in light and dark conductivity demonstrates the applicability of the filament array as an optical switch. Unlike conventional nanowire devices, the photoconductivity of the in-fiber filament array is unaffected by changes in the local environment due to contamination or humidity, as the filaments are clad in the protective fiber matrix. The simplicity of electrical contact to the filament arrays by directly connecting fiber end facets is a direct result of the fabrication method. The filaments themselves are formed in a unidirectional process, imparting a completely uniform global orientation. The fiber matrix forms a protective and mechanically tough sheath that enables simple and macroscopic manipulation to be carried out in a straightforward fashion without expensive nano-manipulation techniques, circumventing a major challenge to the large-scale integration of filament devices such as photodetectors.

These examples and the description above demonstrate the many advantages of the in-fiber filament production process and the attributes of the filaments for many applications. The filaments are produced in a high-throughput and low-cost fashion by a fiber draw process that can be precisely and reproducibly controlled. The filaments are produced as an in-fiber array of filaments that are well-ordered with parallel alignment, and the filaments are protected in the encapsulating matrix material of the fiber, thereby enabling manual manipulation until a need to extract filaments should arise. The challenges posed by the fragility of nanostructures in general during handling are therefore eliminated. Of particular advantage is the exceptionally long length at which filaments can be produced by the in-fiber drawing process and the ability to provide filaments as conducting, semiconducting, or other filament material composition. Bundles of such filaments are thereby well-suited for enabling many large-area applications including renewable energy, such as photovoltaics, and thermoelectric, as well as bioengineering, such as scaffolding for tissue growth, among other applications.

It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A structure comprising:
    a fiber preform, having a preform diameter, the fiber preform including a fiber matrix material and a continuous layer of filament material having first and second faces and arranged with the fiber matrix material adjacent to each of the first and second faces, the continuous filament material layer having a thickness and a viscosity that enforce breakup of the continuous filament material layer into an array of in-fiber filaments upon drawing of the preform into a fiber;
    a draw-down region connecting the fiber preform and a fiber; and
    the fiber, having a fiber length and a fiber diameter that is less than the preform diameter, the fiber including an array of in-fiber filaments extending the fiber length, each filament in the array consisting of the filament material and circumferentially separated from other filaments by the fiber matrix material of the fiber preform.

2. The structure of claim 1 wherein the fiber matrix material comprises a polymeric insulating material.

3. The structure of claim 2 wherein the polymeric insulating material has a glass transition temperature.

4. The structure of claim 2 wherein the polymeric insulating material is selected from the group consisting of polysulfone, poly-ether sulfone, and poly-methyl methacrylate.

5. The structure of claim 1 wherein the in-fiber filaments and the continuous filament material layer comprise a metal.

6. The structure of claim 5 wherein the metal is selected from the group consisting of Sn and Bi.

7. The structure of claim 1 wherein the in-fiber filaments and the continuous filament material layer comprise a semiconducting material.

8. The structure of claim 7 wherein the semiconducting material comprises a chalcogenide glass material.

9. The structure of claim 7 wherein the semiconducting material is selected from the group consisting of Se, $As_2Se_3$, and $(As_{40}Se_{60})_{1-x}Sn_x$.

10. The structure of claim 7 wherein the semiconductor material comprises a glassy inorganic semiconducting material.

11. The structure of claim 7 wherein the semiconducting material has a glass transition temperature.

12. The structure of claim 1 wherein each filament in the array of in-fiber filaments has a thickness and a width that are less than average grain size of the filament material in a polycrystalline state, whereby each in-fiber filament is single-crystal.

13. The structure of claim 1 wherein the in-fiber filaments are semiconducting; and further comprising at least one non-filament metallic in-fiber element extending the fiber length.

14. The structure of claim 1 wherein the in-fiber filaments are semiconducting; and further comprising at least one non-filament semiconducting fiber element extending the fiber length.

15. The structure of claim 1 wherein the in-fiber filaments are metallic; and further comprising at least one non-filament semiconducting fiber element extending the fiber length.

16. A method for producing a fiber comprising:
    assembling a fiber preform including a continuous filament material layer having a filament material viscosity and having a continuous filament material layer thickness, with a fiber matrix material being adjacent to each face of the continuous filament material layer; and
    drawing the preform into a fiber such that for the filament material viscosity and continuous filament, material layer thickness the continuous filament material layer breaks up into an array of isolated in-fiber filaments extending a fiber length.

17. The method of claim 16 further comprising consolidating the fiber preform prior to drawing the preform into a fiber.

18. The method of claim 16 further comprising crystallizing the in-fiber filaments after drawing the preform into a fiber.

19. The method of claim 18 wherein filament crystallizing comprises annealing the in-fiber filaments.

20. The method of claim 16 wherein the fiber matrix material comprises a polymeric insulating material.

21. The method of claim 20 wherein the polymeric insulating material has a glass transition temperature.

22. The method of claim 20 wherein the polymeric insulating material is selected from the group consisting of polysulfone, poly-ether sulfone, and poly-methyl methacrylate.

23. The method of claim 16 wherein the in-fiber filaments and the continuous filament material layer comprise a metal.

24. The method of claim 23 wherein the metal is selected from the group consisting of Sn and Bi.

25. The method of claim 16 wherein the in-fiber filaments and the continuous filament material layer comprise a semiconducting material.

26. The method of claim 25 wherein the semiconducting material comprises a chalcogenide glass material.

27. The method of claim 25 wherein the semiconducting material is selected from the group consisting of Se, $As_2Se_3$, and $(As_{40}Se_{60})_{1-x}Sn_x$.

* * * * *